(12) United States Patent
Blochwitz-Nimoth et al.

(10) Patent No.: US 7,355,197 B2
(45) Date of Patent: Apr. 8, 2008

(54) LIGHT-EMITTING COMPONENT AND PROCESS FOR ITS PREPARATION

(75) Inventors: Jan Blochwitz-Nimoth, Dresden (DE); Gildas Sorin, Dresden (DE)

(73) Assignee: NovaLED GmbH, Dresden (DE)

( * ) Notice: Subject to any disclaimer, the term of this patent is extended or adjusted under 35 U.S.C. 154(b) by 211 days.

(21) Appl. No.: 10/928,976

(22) Filed: Aug. 27, 2004

(65) Prior Publication Data

US 2005/0110009 A1 May 26, 2005

(30) Foreign Application Priority Data

Aug. 27, 2003 (DE) ............................. 103 39 772

(51) Int. Cl.
*H01L 35/24* (2006.01)
*H01L 51/00* (2006.01)

(52) U.S. Cl. ......................... 257/40; 257/103
(58) Field of Classification Search ................. 257/40, 257/87–103; 313/504
See application file for complete search history.

(56) References Cited

U.S. PATENT DOCUMENTS

| | | |
|---|---|---|
| 6,784,016 B2 | 8/2004 | Long et al. ............. 438/99 |
| 6,806,491 B2 * | 10/2004 | Qiu et al. ............. 257/40 |
| 6,858,327 B2 * | 2/2005 | Tsai et al. ............. 428/690 |
| 6,916,554 B2 * | 7/2005 | Ma et al. ............. 428/690 |
| 2003/0020073 A1 | 1/2003 | Long et al. |
| 2003/0127967 A1 * | 7/2003 | Tsutsui et al. ............. 257/40 |
| 2003/0230980 A1 * | 12/2003 | Forrest et al. ............. 313/600 |
| 2004/0062949 A1 | 4/2004 | Pfeiffer et al. |
| 2004/0251816 A1 | 12/2004 | Leo et al. ............. 313/504 |
| 2006/0033115 A1 | 2/2006 | Blochwitz et al. ............. 257/94 |

FOREIGN PATENT DOCUMENTS

| | | |
|---|---|---|
| DE | 10058578 | 6/2002 |
| DE | 10135513 | 2/2003 |
| DE | 10215210 | 10/2003 |

OTHER PUBLICATIONS

Zhou et al. (2002) "Low-voltage inverted transperent vacuum deposited organic light-emitting diodes using electrical doping", Applied Physics Letters 81(5): 922-924.
Huang et al. (2002) "Low-voltage organic electroluminescent devices using pin structures", Applied Physics Letters 80(1): 139-141.
Zhou et al. (2001) "Very-low-operating-voltage organic light-emitting diodes using a p-doped amorphous hole injeciton layer", Applied Physics Letters 78(4): 410-412.
Tang et al. (1987) "Organic electroluminescent diodes", Appl. Phys. Lett. 51(12): 913-915.

* cited by examiner

*Primary Examiner*—Cuong Nguyen
(74) *Attorney, Agent, or Firm*—Baker Botts LLP; Manu J. Tejwani

(57) ABSTRACT

A light-emitting component comprising organic layers and having several layers between a base contact and a cover contact, the corresponding process for its preparation. At least one polymer layer and two molecular layers are arranged, so that when the cover contact is a cathode, the layer adjacent to the cover contact is designed as an electron-transporting molecular layer and is doped with an organic or inorganic donor, the electron-transporting layer comprising a principal organic substance and a donor-type doping substance, the molecular weight of the dopant being more than 200 g/mole. When the cover contact is an anode, the layer adjacent to the cover contact is designed as a p-doped hole-transporting molecular layer and is doped with an organic or inorganic acceptor, the hole-transporting layer comprising a principal organic substance and an acceptor-like doping substance, the molecular weight of the dopant being more than 200 g/mole.

24 Claims, 1 Drawing Sheet

LIGHT-EMITTING COMPONENT AND PROCESS FOR ITS PREPARATION

CROSS-REFERENCE TO RELATED APPLICATION

The present application claims priority from German Patent Application No. 103 39 772.8-3, filed Aug. 27, 2003, the entire disclosure of which incorporated herein by reference.

FIELD OF THE INVENTION

The present invention relates to a light-emitting component comprising organic layers, and in particular to an organic light-emitting diode, consisting of several layers between a base contact on a substrate and a cover contact. The present invention also relates to a processes for the preparation of a light-emitting component, in which a base contact, several layers, and a cover contact are arranged on a substrate.

BACKGROUND OF THE INVENTION

Ever since the demonstration of low operating voltages by Tang et al. 1987 (C. W. Tang et al., Appl. Phys. Lett. 51(12), 913 (1987)), organic light-emitting diodes have been promising candidates for the realization of large-area displays and other uses, such as, e.g., lighting elements. They consist of a sequence of thin (typically 1 nm to 1 μm) layers of organic materials, which are preferably vapor-deposited in vacuum in the form of small molecules, whereby so-called OLEDs are produced, or are spun on from a solution, pressed or deposited in another suitable form (polymers), whereby so-called PLEDs are produced. By injecting charge carriers (electrons from one side, holes from the other side) from the contacts into the organic layers situated therebetween as a result of an externally applied voltage, the subsequent formation of excitons (electron-hole pairs) in an active zone and radiant recombination of these excitons, light is produced and emitted by the light-emitting diode.

Usually, organic light-emitting diodes in the form of PLEDs are based on the following layer structure:

1. Substrate (transparent, e.g. glass)
2. Anode (transparent, usually indium tin oxide (ITO)
3. Hole-transporting layer or hole-injecting layer (usually PEDOT:PSS or PANI=polyaniline with admixtures such as PSS; PEDOT=polyethylenedioxythiophene, PSS=polystyrene sulfonate)
4. Active polymer (emits light)
5. Cathode (usually a metal having a low work function, such as barium, calcium)

The polymeric layers, i.e., the hole transporting or hole-injecting layer and the active polymer are prepared from a liquid solution (in water or solvents). The contacts (anode, cathode) are typically produced by vacuum processes.

The advantages of this structure for applications such as displays is the variety of processes available for the preparation of the polymeric layers, including processes permitting simple lateral structuring of the PLEDs, namely ink-jet pressing. In this process, the different polymers of three colors are pressed on at previously prepared sites, whereby adjacent regions of different emission color are obtained.

The drawback consists, among other things, in the fact that not more than two different polymeric layers can be rationally applied, since the solvents of the polymers must be selected in such a way that they do not mutually affect each other, and, in other words, they do not attack the substrate material. This means that the emitting polymer must also be simultaneously well suited for both electron transport and electron injection from the cathode, a requirement which represents a serious limitation in the selection of material and structure optimization.

On top of this, the sequence of the structure for a given material system can be changed only with difficulty; thus, as in the above case, one must start with the anode. This is disadvantageous particularly for the integration of the PLEDs on active-matrix display substrates with n-channel transistors as a switch component. The use of transparent cover contacts (also as cathode) is just as difficult, since they are usually prepared by a sputter process (e.g., ITO). However, this destroys organic materials. Since the topmost layer in a PLED is an emitting layer, the efficiency of light production of the organic light-emitting diode is thereby reduced. An improvement of the stability against sputter damages can be obtained by introducing a layer vapor-deposited in vacuum, consisting of small molecules. However, even in this case the electron injection from the cathode represents a problem. A further drawback of the above structure is that an efficient electron injection can be achieved only with very unstable contact materials such as barium or calcium. These materials, however, are attacked by oxygen and water.

Organic light-emitting diodes in the form of OLEDs are built up of small molecules that are vapor-deposited in vacuo. If the small molecules which are to form the layers of the OLEDs are small enough, they can usually be deposited by a thermal process without decomposition. To this end the molecules are vaporized in vacuo (because of the long free path).

To improve the injection from the contacts into the organic layer and increase the conductivity of the transporting layers, the transporting layers may be doped by mixed evaporation with organic or inorganic dopants which are acceptors (for hole doping) or donors (for electron doping). In this case, the dopants must not, at the beginning of the evaporation process, be present in their final form, as long as the alternatively used precursor material forms the dopant during the evaporation process (which can be modified as well, e.g., through the use of electron rays). The mixed layers are typically prepared by mixed (co)vaporization.

In addition to the doped transporting layers it is necessary to then introduce intrinsic (i.e., not doped) intermediate layers having specified energetic properties (Patent DE 100 58 578, M. Pfeiffer et al., "Light-emitting component comprising organic layers", filed on Nov. 20, 2000; X. Zhou et al., Appl. Phys. Lett. 78, 410 (2001)).

In that case, the structure of the OLED is a p-i-n heterostructure:
1. Carrier, substrate,
2. Electrode, hole-injecting (anode=positive pole), preferably transparent,
3. p-doped hole-injecting and transporting layer,
4. Thinner hole-side blocking layer of a material whose band positions match the band positions of the layers surrounding it,
5. Light-emitting layer,
6. Electron-side blocking layer (typically thinner than the layer mentioned below) of a material whose band positions match the band positions of the layers surrounding it,
7. n-doped electron-injecting and transporting layer.
8. Electrode, usually a metal having a low energy function, electron-injecting (cathode=negative pole).

Advantages of this structure are the separate optimizability of the properties of the individual layers, the large adjustable distance between the emitter layer and the contacts, the very good injection of the charge carriers into the organic layers, and the low thickness of the layers whose conductivity is not very good (4; 5; 6). In this way, very low operating voltages (<2.6 V for a light density of 100cd/m$^2$) at a simultaneously high light production efficiency can be achieved, as described in J. Huang, M. Pfeiffer, A. Werner, J. Blochwitz, Sh. Liu and K. Leo in Appl. Phys. Lett. 80, 139-141 (2002): "Low-voltage organic electroluminescent devices using pin structures." As shown in DE 101 35 513.0 and in X. Q. Zhou et al., Appl. Phys. Lett. 81, 922 (2002), this structure can, in addition, be easily inverted and top-emitting and fully transparent OLEDs can be realized, as described in DE 102 15 210.1.

The drawback of this structure is that lateral structuring of the OLED structure for the build-up of different-color pixels in one display can only be carried out through shadow masks. This process has limitations with regard to the smallest achievable pixel sizes (<50 μm subpixels). In a manufacture, the shadow mask process is a relatively expensive process. To be sure, the ink-jet process cannot be used in the case of small molecules, due to their insolubility.

U.S. 2003/020073 A1 describes the use of vapor-deposited blocking layers and electron-transporting layers on a polymeric hole-transporting layer. In this arrangement, the possibility exists of structuring the polymeric layer laterally, in order to produce a full color display. However, with this arrangement, the injection of charge carriers (in this case, electrons from the cathode into the molecular electron-transporting layer) is problematical, which increases the operating voltage of the hybrid polymer-small molecule OLED.

Hence, it is the object of the invention to increase the flexibility of construction of a light-emitting component and the injection of charge carriers into the organic layers, while maintaining a good structurability.

This object is achieved from the arrangement point of view by arranging at least one polymer layer and two molecular layers, and, when the cover contact is a cathode, the layer adjacent to the cover contact is formed as an electron-transporting molecular layer and is doped with an organic or inorganic dopant, the n-type dopant containing a principal organic substance and a donor-type doping substance, and the molecular weight of the dopant is greater than 200 g/mole; or, when the cover contact is an anode, the layer adjacent to the cover contact is formed as a p-doped hole-transporting molecular layer and is doped with an organic or inorganic acceptor, the dopant containing a principal organic substance and an acceptor-type doping substance, and the molecular weight of the dopant is greater then 200 g/mole. Through the incorporation of molecular layers it is possible to achieve a considerably greater flexibility in the layer composite, while the simultaneous presence of polymer layers assures easier structurability without the special use of shadow masks.

The dopant should consist of an organic, inorganic or organometallic molecule, which has a molecular weight of more than 200 g/mole, preferably more than 400 g/mole. What matters here is that the dopant active in the layer have this molecular weight. For example, $Cs_2CO_3$ (cesium carbonate, molecular weight about 324 g/mole) is unsuitable, within the meaning of the invention, as donor for n-doping of the electron-transporting layer. $Cs_2CO_3$ as such is a comparatively stable compound which is no longer in a position to transfer one or more electrons to another molecule (the matrix material). To be sure, molecular Cs can be liberated in a vaporization process above 615° C. (decomposition temperature), and this Cs would be able, as dopant, to transfer an electron to the matrix material. However, the molecular weight of Cs is about 132 g/mole. Cesium, as dopant, has the disadvantage that, as a relatively small molecule or atom, it cannot be incorporated in the matrix layer in a diffusion-stable manner, and has negative effects on the service life of the organic light-emitting component. The same applies in the case of p-doping of the hole-transporting layer with a strong acceptor (in the case of an inverted POLED construction).

The two molecular vapor-deposited layers are the non-doped intermediate layer (reference numeral 5 in the embodiment described below) and the doped transporting layer. Since the energy barrier of the charge-carrier injection from the doped transporting layer into the polymeric emitting layer is too large for common emitter polymers such as polyphenylenevinylene, PPV (in the case of the traditionally known layer structure with polymeric hole-transporting layer on a substrate, the barrier for the injection of electrons), a non-doped intermediate layer must be inserted which is considerably thinner than the doped transport layer and whose LUMO energy level (LUMO: lowest unoccupied molecular orbital), and, to be sure, in case of the hole-transporting layer, the HOMO energy level (HOMO: highest occupied molecular orbital) must be between the doped transporting layer and the emitter polymer layer. This has the consequence, on the one hand, that charge carriers can be more effectively injected into the emitter polymer layer, and on the other hand, that nonradiant recombination processes also occur at the interface between the emitter polymer layer and the doped transporting layer, these usually taking place almost inevitably at high energy barriers.

From the process point of view, the object of the invention is achieved by arranging at least one of the layers as a polymer layer and vapor-depositing at least one of the layers as a molecular layer, said molecular layer being doped.

Advantageously, the doping of the molecular layer is carried out in a vacuum as a mixed vapor deposition from two separately controlled sources.

The deposition of the polymer layers can be carried out in a very precise manner by using simple means. This structuring serves, at the same time, for structuring the later light-emitting component, without the necessity of expensive structuring steps or structuring means. By contrast, the deposition of molecular layers prevents a situation where, as a result of the presence of usually only two disjunct solvents, the modification of polymer layers will be very limited and increase the possibility of the build-up of the most varied layer combinations.

Below, the invention will be explained in greater detail on the basis of one embodiment.

SUMMARY OF THE INVENTION

The present invention relates to a light-emitting component comprising organic layers, and in particular to an organic light-emitting diode, consisting of several layers between a base contact on a substrate and a cover contact. The present invention also relates to a processes for the preparation of a light-emitting component, in which a base contact, several layers, and a cover contact are arranged on a substrate.

According to one embodiment of the present invention, the light-emitting component includes organic layers consisting of several layers between a base contact on a substrate and a cover contact, having layers formed as a polymer layer consisting of polymer, and layers formed as a molecular layer consisting of vacuum-deposited small molecules, wherein the light-emitting component includes at least one polymer layer and at least two molecular layers. The cover contact may be a cathode, the layer adjacent to the cover contact may be a doped layer formed as an electron-transporting molecular layer and doped with an organic or inorganic donor, the n-type dopant includes a principal organic substance and a donor-type doping substance, and the molecular weight of the dopant may be more than about 200 g/mole.

According to another embodiment of the present invention, the light-emitting component includes organic layers consisting of several layers between a base contact on a substrate and a cover contact, having layers formed as a polymer layer consisting of polymer, and layers formed as a molecular layer consisting of vacuum-deposited small molecules, wherein the light-emitting component includes at least one polymer layer and at least two molecular layers. The cover contact may be an anode, the layer adjacent to the cover contact may be a doped layer formed as a p-doped hole-transporting molecular layer and doped with an organic or inorganic acceptor, the dopant may include a principal organic substance and an acceptor-type doping substance and the molecular weight of the dopant may be more than 200 g/mole.

DETAILED DESCRIPTION OF PREFERRED EMBODIMENT

Figure 1:
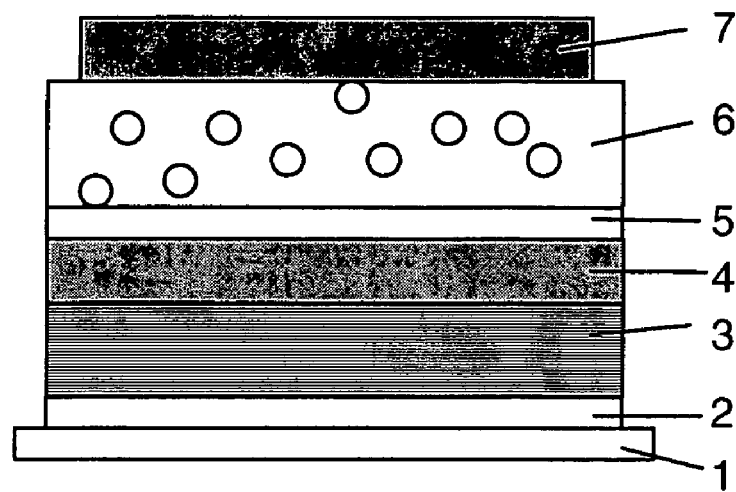
FIG. 1 shows a first layer construction of an organic light-emitting diode according to the invention.

As shown in FIG. 1, a transparent base contact 2 is placed as anode on a substrate 1. Deposited on this base contact 2 is a first polymer layer as polymeric hole-transporting layer 3, and a second polymer layer as polymeric emitter layer 4. This layer composite of a first and second polymer layer consists of PEDIT:PSS (Baytron-P) of H. C. Stark, Germany. Vapor deposited thereon is a first molecular layer as intermediate layer 5 which consists of a 10 nm layer of BPhen (batophenanthroline). Arranged thereon is a second molecular layer in the form of an electron-transporting layer and injecting layer 6 of BPhen:Cs (molar doping concentration about 10:1 to 1:1). Finally, the organic light-emitting diode according to FIG. 1 is provided with an aluminum cover contact 7.

In this connection, Cs can be regarded as a non-expedient electron-yielding dopant, since the molecular weight of Cs is too low to be able to achieve a diffusion-stable doped layer therewith. Provided, therefore, are doping materials having a molecular weight of more than 200 g/mole, preferably more than 400 g/mole. and a redox potential in the range of Cs. Cs has a standard redox potential of −2.922 V and an ionization energy of 3.88 eV. The ionization energy of the dopant is less than 4.1 eV.

An example for this dopant is tungsten paddlewheel [$W_2(hpp)4$]:

[0031] An example for this dopant is tungsten paddlewheel [W$_2$(hpp)$_4$]:
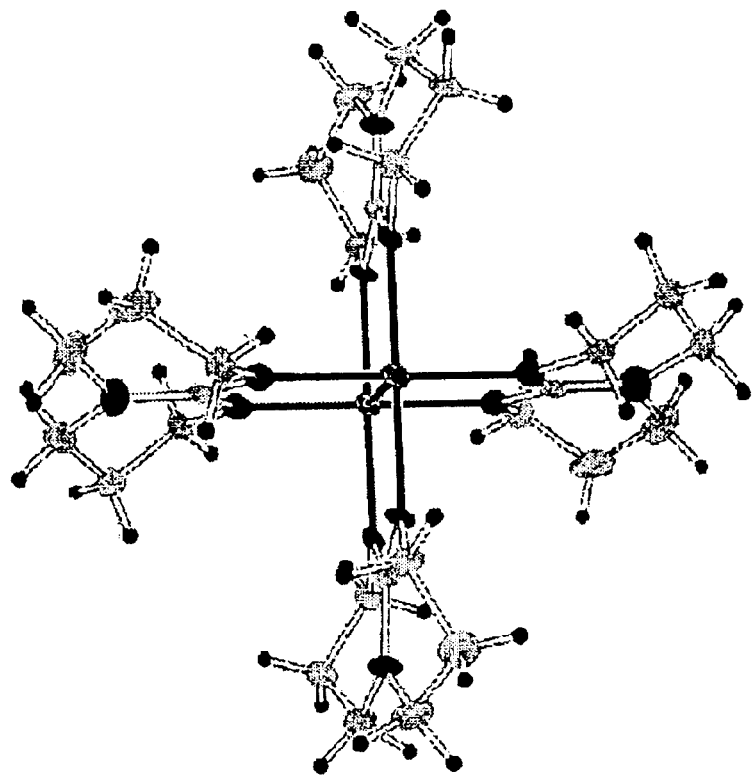

Tungsten paddlewheel has an ionization potential of about 3.75 eV. The structure of the hpp anion of single negative charge is:

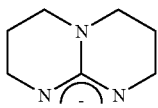

From comparisons with the gas-ionization potential of molecular Cs of 3.9 eV and the electron affinity of BPhen, as a layer, of about 2.4 eV, it can be estimated that it is necessary that the donor dopant for OLED transporting materials have an ionization potential of less than 4.1 eV.

The doped layer (e.g., BPhen:Cs in the above case) must have a conductivity in the range of 1E-7 S/cm to 1E-3S/cm, and preferably in the range of 1E-6S/cm to 5E-5S/cm. The conductivity of the non-doped intermediate layer (e.g., BPhen in the above case) must be in a range of about 1E-10S/cm to 5E-8S/cm. Thus, the conductivity of the non-doped layer is lower by at least a half order of magnitude than that of the doped layer. The preferred ranges of thickness of the doped layer are between 40 nm and 500 nm, preferably 50 nm to 300 nm, and those of the non-doped intermediate layer between 2 nm and 30 nm, and preferably between 5 nm and 15 nm. Because of its lower conductivity, the non-doped layer must be considerably thinner than the doped layer. Of course, the considerations regarding layer thickness and conductivity also apply for the p-doping of the hole-transporting layer according to the embodiment 2 presented below.

This embodiment can be modified by having a single layer as polymeric hole-transporting layer 3 and polymeric emitter layer 4, said single layer assuming both functions, hence only a single polymer layer can be present. Furthermore, the base contact 2 can also be designed so that it is nontransparent (e.g. gold, aluminum), and then design the cover contact 7, as cathode, to be transparent, e.g. through an ITO layer prepared by a sputter process. Because of the doping of layer 6, an electron injection from ITO into layer 6 is still possible. Moreover, the dopant concentration in the case of organic dopants can be between 1:1000 and 1:20, and in the case of inorganic dopants, between 1:1000 and 3:1.

As can be seen, the organic light-emitting diode according to the invention consists of both polymer layers and molecular layers and hence can logically called as POLED or hybrid OLED.

Figure 2:
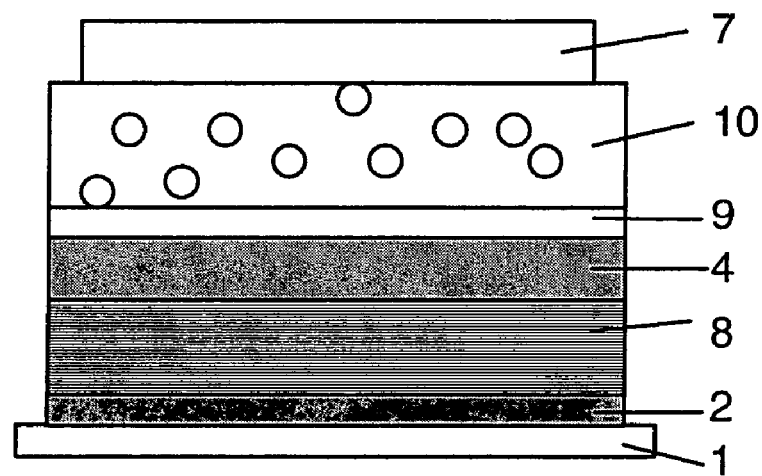
FIG. 2 shows a second layer construction—electrically inverse to FIG. 1—of an organic light-emitting diode according to the invention.

An alternative embodiment is represented in FIG. 2. It shows a construction that is electrically inverse to FIG. 1. A base contact 2 as cathode is arranged on a substrate 1. The base contact 2 is formed as a nontransparent cathode (calcium, barium or aluminum), but can also be transparent (ITO). Deposited on this base contact 2 is a first polymer layer as polymeric electron-transporting layer 8 and a second polymer layer as polymeric emitter layer 4. Vapor-deposited on the latter is a first molecular layer as intermediate layer 9 which may consist of a 10 nm thick layer of TDP (triphenyldiamine). Situated thereon is a second molecular layer in the form of a hole-transporting and injecting layer 10 consisting of, e.g., m-MTDATA doped with F4-TCNQ (tris-(3-methylphenylphenylamino)-triphenylamine doped with tetrafluorotetracyanoquinodimethane) in a molar ratio of about 50:1. Finally, the organic light-emitting diode according to FIG. 2 is provided with an anode as cover contact 7 consisting e.g. of transparent ITO.

Further embodiments (not shown) consist in exchanging the sequence of polymer layers and molecular layers, in other words, in arranging on the substrate 1, for the base contact 2, a doped molecular layer 10 or 6, and then depositing thereon the laterally structurable polymer layers 4 and 8 or 3. Another alternative is an embodiment wherein an active polymeric emitter layer 4 is framed by organic molecular layers.

If an anode is deposited on the base contact 2, then the adjacent sequence is molecular doped hole-injecting and -transporting layer 10, intermediate layer 9, polymeric layer 4, intermediate layer 5, and doped molecular electron-transporting layer 10 and cover contact 7 as cathode. If the cathode is deposited as base contact 2 on substrate 1, then the sequence is inverted.

What is claimed:

1. A light-emitting component comprising organic layers, consisting of several layers between a base contact on a substrate and a cover contact, having layers formed as a polymer layer consisting of polymer, and layers formed as a molecular layer consisting of vacuum-deposited small molecules,
   wherein the light-emitting component comprises at least one polymer layer and at least two molecular layers,
   wherein the cover contact is a cathode, the layer adjacent to the cover contact is a doped layer formed as an electron-transporting molecular layer and doped with an organic donor dopant, the n-type dopant comprising a principal organic substance and a donor-type doping substance, and the molecular weight of the dopant is more than about 200 g/mole, and
   wherein the conductivity of a non-doped intermediate layer between the base contact on the substrate and the cover contact is lower by at least a half order of magnitude than the conductivity of the doped layer.

2. The light-emitting component according to claim 1 wherein the donor-type doping substance in the electron-transporting layer is tungsten paddlewheel [$W_2(hpp)_4$] with hpp=1, 3, 4, 6, 7, 8-hexahydro-2H-pyrimido-[1, 2-a]-pyrimidine.

3. The light-emitting component according to claim 1, wherein the doped layer has a conductivity in the range of 1E-7 S/cm to 1E-3 S/cm.

4. The light-emitting component according to claim 1, wherein the doped layer has a conductivity in the range of 1E-6 S/cm to 5E-5 S/cm.

5. The light-emitting component according to claim 1, wherein the doped layer has a thickness in the range of 40 nm to 500 nm.

6. The light-emitting component according to claim 1, wherein the doped layer has a thickness in the range of 50 nm to 300 nm.

7. The light-emitting component according to claim 1, wherein a non-doped intermediate layer between the base contact on the substrate and the cover contact has a thickness in the range of 2 nm to 30 nm.

8. The light-emitting component according to claim 1, wherein a non-doped intermediate layer between the base contact on the substrate and the cover contact has a thickness in the range of 5 nm to 15 nm.

9. The light-emitting component according to claim 1, wherein a non-doped layer between the base contact on the substrate and the cover contact is designed to be thinner than the doped layer between the base contact on the substrate and the cover contact.

10. The light-emitting component according to claim 1, wherein the donor dopant has an ionization potential of less than 4.1 eV.

11. The light-emitting component according to claim 1, wherein the concentration of organic dopant relative to that of the doped layer's host material is between 1:1000 and 1:20.

12. The light-emitting component according to claim 1, wherein the concentration of organic dopant relative to that of the doped layer's host material is between 1:1000 and 3:1.

13. A light-emitting component comprising organic layers, consisting of several layers between a base contact on a substrate and a cover contact, having layers formed as a polymer layer consisting of polymer, and layers formed as a molecular layer consisting of vacuum-deposited small molecules,
wherein the light-emitting component comprises at least two polymer layers and at least two molecular layers,
wherein the cover contact is an anode, the layer adjacent to the cover contact is a doped layer formed as a p-doped hole-transporting molecular layer and doped with an organic acceptor dopant, the dopant comprising a principal organic substance and an acceptor-type doping substance and the molecular weight of the dopant is more than 200 g/mole, and
wherein the conductivity of a non-doped intermediate layer between the base contact on the substrate and the cover contact is lower by at least a half order of magnitude than the conductivity of the doped layer between the base contact on the substrate and the cover contact.

14. The light-emitting component according to claim 13 wherein the doped layer has a thickness in the range of 40 nm to 500 nm.

15. The light-emitting component according to claim 13 wherein the doped layer has a thickness in the range of 50 nm to 300 nm.

16. The light-emitting component according to claim 13 wherein a non-doped intermediate layer between the base contact on the substrate and the cover contact has a thickness in the range of 2 nm to 30 nm.

17. The light-emitting component according to claim 13 wherein a non-doped intermediate layer between the base contact on the substrate and the cover contact has a thickness in the range of 5 nm to 15 nm.

18. The light-emitting component according to claim 13 wherein a non-doped layer between the base contact on the substrate and the cover contact is designed to be thinner than the doped layer.

19. The light-emitting component according to claim 13 wherein the organic dopant concentration relative to that of the doped layer's host material is between 1:1000 and 1:20.

20. The light-emitting component according to claim 13 wherein the dopant concentration relative to that of the doped layer's host material is between 1:1000 and 3:1.

21. The light-emitting component of claim 1 wherein the at least one polymer layer is a light emitting layer.

22. The light-emitting component of claim 13 wherein the at least one polymer layer is a light emitting layer.

23. The light-emitting component of claim 13 wherein the donor-type doping substance in the electron-transporting layer is tungsten paddlewheel [$W_2(hpp)_4$] with hpp=1, 3, 4, 6, 7, 8-hexahydro-2H-pyrimido-[$_{1,2}$-a]-pyrimidine.

24. The light-emitting component of claim 13, wherein the doped layer has a conductivity in the range of 1E-7 S/cm to 1E-3 S/cm.

* * * * *

UNITED STATES PATENT AND TRADEMARK OFFICE
CERTIFICATE OF CORRECTION

PATENT NO. : 7,355,197 B2  Page 1 of 1
APPLICATION NO. : 10/928976
DATED : April 8, 2008
INVENTOR(S) : Jan Blochwitz-Nimoth and Gildas Sorin It is certified that error appears in the above-identified patent and that said Letters Patent is hereby corrected as shown below:

ON THE TITLE PAGE:

Item (73) Assignee:

"NovaLED GmbH" should read

--NovaLED AG--

Signed and Sealed this

Seventeenth Day of February, 2009

JOHN DOLL
*Acting Director of the United States Patent and Trademark Office*